US007903823B2

(12) United States Patent
Crump

(10) Patent No.: US 7,903,823 B2
(45) Date of Patent: Mar. 8, 2011

(54) APPARATUS AND METHOD FOR EFFECTING SOUND STAGE EXPANSION

(75) Inventor: Stephen Walter Crump, Jackson, MS (US)

(73) Assignee: Texas Instruments Incorporated, Dallas, TX (US)

( * ) Notice: Subject to any disclaimer, the term of this patent is extended or adjusted under 35 U.S.C. 154(b) by 1356 days.

(21) Appl. No.: 11/408,816

(22) Filed: Apr. 21, 2006

(65) Prior Publication Data

US 2007/0003068 A1 Jan. 4, 2007

Related U.S. Application Data

(60) Provisional application No. 60/676,167, filed on Apr. 28, 2005.

(51) Int. Cl.
*H04R 5/00* (2006.01)
*H04R 5/02* (2006.01)
*H03F 99/00* (2009.01)
*H03F 3/45* (2009.01)

(52) U.S. Cl. ............... 381/17; 381/18; 381/19; 381/300; 381/303; 381/306; 381/27; 381/28; 381/120; 330/69

(58) Field of Classification Search .................. 381/300, 381/310, 17–19, 27, 28, 303, 306, 120; 330/69
See application file for complete search history.

(56) References Cited

U.S. PATENT DOCUMENTS

| | | | | |
|---|---|---|---|---|
| 4,586,192 | A * | 4/1986 | Arntson | 381/303 |
| 5,546,468 | A * | 8/1996 | Beard | 381/86 |
| 2003/0210792 | A1* | 11/2003 | Hoover | 381/1 |

* cited by examiner

*Primary Examiner* — Vivian Chin
*Assistant Examiner* — George Monikang
(74) *Attorney, Agent, or Firm* — John J. Patti; Wade J. Brady, III; Frederick J. Telecky, Jr.

(57) ABSTRACT

An apparatus for effecting sound stage expansion in an audio system presenting two sound channels includes: (a) A first signal source coupled for providing at least one first signal representing a first sound channel to at least one first input locus of a first amplifying unit. The first amplifying unit participates in presenting the first sound channel. (b) A second signal source coupled for providing at least one second signal representing a second sound channel to at least one second input locus of a second amplifying unit. The second amplifying unit participates in presenting the second sound channel. (c) At least one first filter unit coupling the first signal source with at least one of the at least one second input locus. (d) At least one second filter unit coupling the second signal source with at least one of the at least one first input locus.

14 Claims, 3 Drawing Sheets

APPARATUS AND METHOD FOR EFFECTING SOUND STAGE EXPANSION

CROSS-REFERENCE TO RELATED APPLICATIONS

This application claims benefit of prior filed copending Provisional Patent Application Ser. No. 60/676,167, filed Apr. 28, 2005.

TECHNICAL FIELD

The present invention is directed to audio systems, and especially to audio systems presenting two sound channels.

BACKGROUND

The stereo sound stage of a stereo audio system may be regarded as the apparent physical separation between two speakers in the stereo audio system. The sound stage of a stereo audio system is generally reflective of the physical size of the embodiment of the system. By way of example and not by way of limitation small, compact stereo recording playback systems, mobile telephone systems, portable sound playback systems and other similar systems all suffer from a generally small perceived sound stage. A manifestation of such a limitation is a perception by a user of a reduced separation of audio playback channels (e.g., right channel and left channel) during presentation of a stereo audio output.

It is known that subtracting some of a right channel signal from a left channel signal while subtracting some of a left channel signal from a right channel signal can expand the perceived sound stage outside the actual physical separation of the audio output units (e.g., loudspeakers) of a stereo audio system. This system handling approach may be referred to as "cross differencing". Low-frequency acoustic signals behave substantially like general pressure changes in a typical room or space and are generally non-directional. It is common practice among audio system designers to provide for the cross signals to be filtered so that they are significantly reduced at lower frequencies (e.g., below 400 Hertz; Hz) so as to prevent cancellation of bass sound reproduction in the audio system.

Sound stage expansion techniques may be used in connection with video imaging, but voices may be perceived as being displaced from their sources. Such a result may prove to be confusing to viewers, so care must be exercised in employing a sound stage expansion system in connection with video systems.

Sound stage expanding techniques are intended to make an existing stereo sound stage seem wider than the actual physical span of the speakers producing the stereo sound presentation. However, sound stage expansion techniques are generally not themselves a creator of a stereo audio effect. Prior art employments of sound stage expansion have produced a significant variation of center audio images in comparison with left side and right side signals. This variation of center audio images is commonly manifested in voices and instruments being decreased in volume generally at center-stage as compared with left and right audio signals. A result is that listeners have difficulty in overlooking the center audio image variance and the effect of the sound stage expansion is not fully perceived as listeners are distracted by relatively louder left and right output signals compared to output signals appearing at the center. Prior art sound expansion apparatuses have not provided a means for adjusting center stage audio image or volume. Some prior art employments have also produced substantial increases in high frequency components of left and right output signals, or treble boost. As a result, listeners may be distracted by the treble boost and so do not fully perceive the effect of a sound stage expansion. Prior art sound stage expansion apparatuses have not provided a means of controlling treble boost.

Turning to FIG. 1, a schematic diagram of an example of a conventional system can be seen. System 10 includes a left amplifier unit 12 and a right amplifier unit 14. Left amplifier unit 12 has a non-inverting input terminal 20, an inverting input terminal 22 and an output terminal 24. A left signal providing unit 16 has a positive terminal 17 and a negative terminal 19. Positive terminal 17 is coupled with non-inverting input terminal 20. Negative terminal 19 is coupled with a ground terminal 25. A feedback network 30 including resistors $R_1$, $R_2$ couples output terminal 24 with inverting terminal 22, negative terminal 19 and ground terminal 25. Right amplifier unit 14 has a non-inverting input terminal 40, an inverting input terminal 42 and an output terminal 44. A right signal providing unit 36 has a positive terminal 37 and a negative terminal 39. Positive terminal 37 is coupled with non-inverting input terminal 40. Negative terminal 39 is coupled with a ground terminal 25. A feedback network 50 including resistors $R_3$, $R_4$ couples output terminal 44 with inverting terminal 42, negative terminal 39 and ground terminal 25. A cross differencing network 52 including cross differencing capacitor Cc and cross differencing resistor Rc couples a node or terminal 46 between resistors $R_1$, $R_2$ with a node or terminal 48 between resistors $R_3$, $R_4$.

In operation, amplifier unit 12 will force left feedback voltage $VL_f$ at inverting input terminal 22 to equal left input voltage $VL_i$ from left signal providing unit 16. This in effect applies an inverted left input voltage $VL_i$ to output terminal 44 via cross differencing network 52 and inverting input terminal 42 of right amplifier unit 14. The result is a reducing of right output voltage $VR_o$ at output terminal 44 by an amount related with an inverted left input signal $VL_i$. Similarly, amplifier unit 14 will force right feedback voltage $VR_f$ at inverting input terminal 42 to equal right input voltage $VR_i$ from right signal providing unit 36. This in effect applies an inverted right input voltage $VR_i$ to output terminal 24 via cross differencing network 52 and inverting input terminal 22 of left amplifier unit 12. The result is a reducing of left output voltage $VL_o$ at output terminal 24 by an amount related with an inverted right input signal $VR_i$. This cross differencing signal effects sound stage expansion using apparatus 10. However, cross differencing network 52 has a deleterious effect in that it increases gain for both of amplifier units 12, 14 above its characteristic frequency $f_c$:

$$f_c = \frac{1}{2\pi R_c C_c}, \tag{1}$$

where $R_c$ is the value of resistor $R_c$ in network 52 and $C_c$ is the value of capacitor $C_c$ in network 52. Increasing gain for amplifier units 12, 14 at frequencies higher than characteristic frequency $f_c$ is manifested as increased volume for higher frequency signals, such as treble audio output signals. As mentioned earlier herein, such variation of treble signals is distracting to listeners. The effect of the sound stage expansion is not fully perceived as listeners concentrate on louder treble signals to the left and right. Sound stage expansion apparatus 10 does not provide a means for adjusting high frequency response or center stage audio image or volume.

There is a need for an apparatus and method for effecting sound stage expansion that permits mitigating of center audio image variation and controls treble boost in sound presentation.

SUMMARY

In accordance with a preferred embodiment of the present invention, an apparatus for expanding sound stage representation of an audio system presenting two sound channels is provided. The apparatus comprises a first amplifier unit having a first inverting input terminal, a first non-inverting input terminal and a first output terminal; a second amplifier unit having a second inverting input terminal, a second non-inverting input terminal and a second output terminal; a right channel signal source coupled for providing a first right channel signal and a second right channel signal to the first amplifier unit; one right channel signal of the first and second right channel signals being provided to the first inverting input terminal, an other right channel signal of the first and second right channel signals being provided to the first non-inverting input terminal; a left channel signal source coupled for providing a first left channel signal and a second left channel signal to the second amplifier unit; one of the first and second left channel signals being provided to the second inverting input terminal, an other one of the first and second left channel signals being provided to the second non-inverting input terminal; a first filter unit coupled for providing filtered the one right channel signal to the second non-inverting input terminal; a second filter unit coupled for providing filtered the other right channel signal to the second inverting input terminal; a third filter unit coupled for providing filtered the one left channel signal to the first non-inverting input terminal; and a fourth filter unit coupled for providing filtered the other left channel signal to the first inverting input terminal.

In accordance with a preferred embodiment of the present invention, the first and second right channels are provided as substantially fully differential signals, and wherein the first and second left channels are provided as substantially fully differential signals.

In accordance with a preferred embodiment of the present invention, at least one selected filter unit of the first filter unit, the second filter unit, the third filter unit and the fourth filter unit includes at least one capacitive unit coupled with at least one resistive unit.

In accordance with a preferred embodiment of the present invention, at least one selected filter unit of the first filter unit, the second filter unit, the third filter unit and the fourth filter unit includes at least one capacitive unit coupled with at least one resistive unit.

In accordance with a preferred embodiment of the present invention, an apparatus is provided. The apparatus comprises a first amplifier having a inverting input terminal, a non-inverting input terminal, and an output terminal; a second amplifier having a inverting input terminal, a non-inverting input terminal, and an output terminal; a first resistor-capacitor (RC) network that receives a first input signal from a left channel signal source and that is coupled to inverting terminal of the first amplifier and the non-inverting terminal of the second amplifier; and a second RC network that receives a second input signal from a right channel signal source and that is coupled to the inverting terminal of the second amplifier and the non-inverting terminal of the first amplifier.

In accordance with a preferred embodiment of the present invention, the apparatus further comprises a resistor network that is coupled between the non-inverting terminals of the first and second amplifiers.

In accordance with a preferred embodiment of the present invention, the first RC network further comprises: a capacitor that receives the first input signal; a first resistor that receives the first input signal and that is coupled to the inverting terminal of the first amplifier; a second resistor that is coupled between the capacitor and the inverting terminal of the first amplifier; a third resistor that is coupled between the capacitor and the non-inverting terminal of the second amplifier; and a fourth resistor that is coupled between the output terminal and the inverting terminal of the first amplifier.

In accordance with a preferred embodiment of the present invention, the second RC network further comprises: a capacitor that receives the second input signal; a first resistor that receives the second input signal and that is coupled to the inverting terminal of the first amplifier; a second resistor that is coupled between the capacitor and the inverting terminal of the second amplifier; a third resistor that is coupled between the capacitor and the non-inverting terminal of the first amplifier; and a fourth resistor that is coupled between the output terminal and the inverting terminal of the second amplifier.

In accordance with a preferred embodiment of the present invention, the first and second input signals are differential, and wherein the first RC network receives a negative portion of the first input signal, and wherein the second RC network receives a negative portion of the second input signal.

In accordance with a preferred embodiment of the present invention, the apparatus further comprises: a third RC network that receives a positive portion of the first input signal and that is coupled to the non-inverting terminal of the first amplifier; and a fourth RC network that receives a positive portion of the second input signal and that is coupled to the non-inverting terminal of the second amplifier.

In accordance with a preferred embodiment of the present invention, the capacitor further comprises a first capacitor, and wherein the third RC network further comprises: a second capacitor that receives the positive portion of the first input signal; a fourth resistor that receives the first input signal and that is coupled to the non-inverting terminal of the first amplifier; a fifth resistor that is coupled between the second capacitor and the non-inverting terminal of the first amplifier; a sixth resistor that is coupled between the second capacitor and the inverting terminal of the second amplifier.

In accordance with a preferred embodiment of the present invention, the capacitor further comprises a first capacitor, and wherein the third RC network further comprises: a second capacitor that receives the positive portion of the second input signal; a fourth resistor that receives the first input signal and that is coupled to the non-inverting terminal of the second amplifier; a fifth resistor that is coupled between the second capacitor and the non-inverting terminal of the second amplifier; a sixth resistor that is coupled between the second capacitor and the inverting terminal of the first amplifier.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
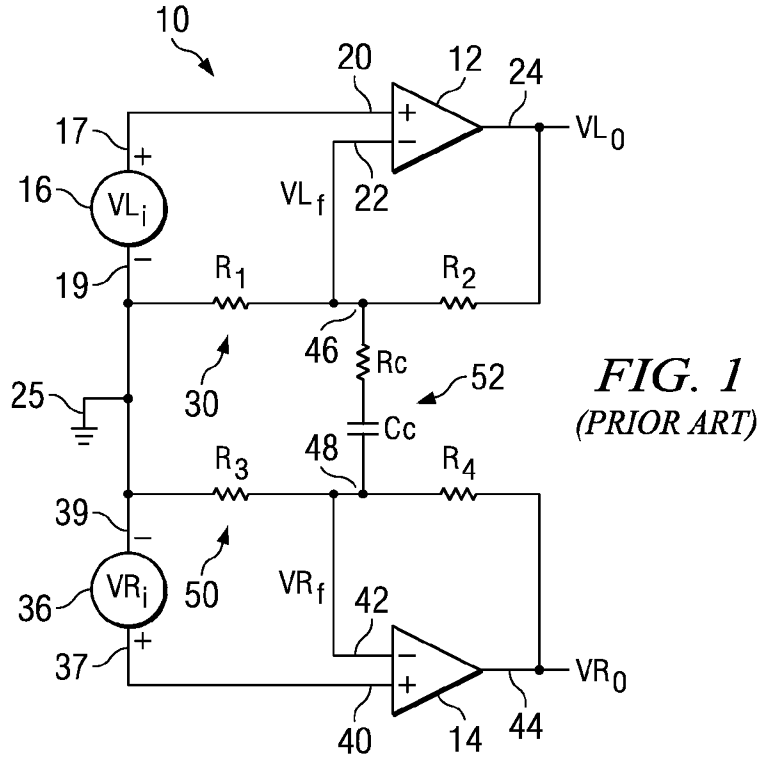
FIG. 1 (PRIOR ART)
FIG. 1 is a circuit diagram of an example of a conventional system.

Refer now to the drawings wherein depicted elements are, for the sake of clarity, not necessarily shown to scale and wherein like or similar elements are designated by the same reference numeral through the several views.

Figure 2:
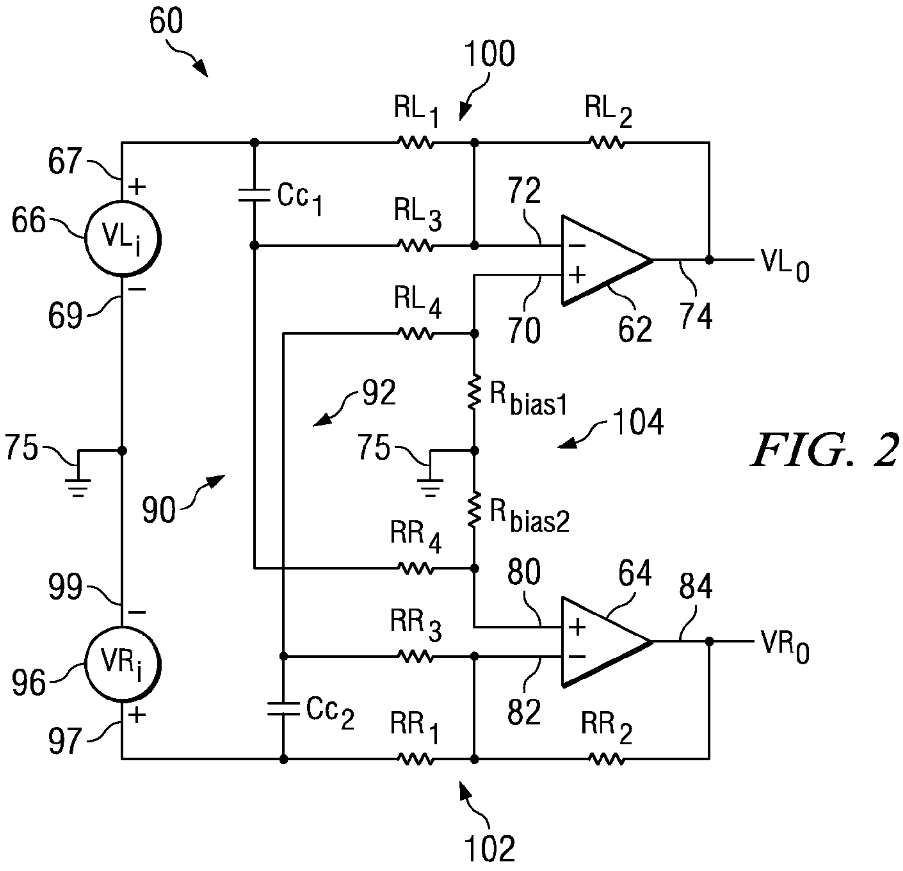
FIGS. 2, 3, and 4 are circuit diagrams of examples of systems in accordance with a preferred embodiment of the present invention.

Turning to FIG. 2, an example of a system in accordance with a preferred embodiment of the present invention can be seen. System 60 includes a left amplifier unit 62 and a right amplifier unit 64. Each of amplifier units 62, 64 has a differential input and a single-ended output. Left amplifier unit 62 has a non-inverting input terminal 70, an inverting input terminal 72 and an output terminal 74. Right amplifier unit 64 has a non-inverting input terminal 80, an inverting input terminal 82 and an output terminal 84. A left signal providing unit 66 has a positive terminal 67 and a negative terminal 69. Positive terminal 67 is coupled with inverting input terminal 72 via a capacitor $Cc_1$ and a resistor $RL_3$. Positive terminal 67 is also coupled with non-inverting terminal 80 via a cross differencing filter unit 90 including capacitor $Cc_1$ and a resistor $RR_4$. Negative terminal 69 is coupled with a ground terminal 75. A right signal providing unit 96 has a positive terminal 97 and a negative terminal 99. Positive terminal 97 is coupled with inverting input terminal 82 via a capacitor $Cc_2$ and a resistor $RR_3$. Positive terminal 97 is also coupled with non-inverting terminal 70 via a cross differencing filter unit 92 including capacitor $Cc_2$ and a resistor $RL_4$. Negative terminal 99 is coupled with ground terminal 75. A feedback network 100 including resistors $RL_1$, $RL_2$ couples output terminal 74 with inverting terminal 72 and positive terminal 67. A feedback network 102 including resistors $RR_1$, $RR_2$ couples output terminal 84 with inverting terminal 82 and positive terminal 97. A network 104 including resistors $R_{bias1}$, $R_{bias2}$ couples non-inverting input terminals 70, 80 with ground terminal 75.

System 60 avoids increasing perceived center treble signals as occurred in prior art apparatus 10 (FIG. 1) because network 104 is not coupled to participate in either of feedback networks 100, 102 and therefore does not affect gain of either of amplifier units 62, 64. System 60 effects cross differencing in order to realize sound stage expansion via cross differencing filter units 90, 92. Cross differencing connection is effected so that a portion of right channel input signal $VR_i$ from right signal providing unit 96 is applied to non-inverting input 70 to subtract that cross difference connected right signal portion from output signal $VL_o$. Cross differencing connection is also effected so that a portion of left channel input signal $VL_i$ from left signal providing unit 66 is applied to non-inverting input 80 to subtract that cross difference connected left signal portion from output signal $VR_o$.

Cross differencing filter units 90, 92 permit adjustment of center audio image presented by system 60. Changing values of capacitors $Cc_1$, $Cc_2$ or resistors $RL_4$, $RR_4$ can alter the center image presented by system 60 to a significant degree. Filter circuitry established by capacitor $Cc_1$ with resistor $RL_3$ and established by capacitor $Cc_2$ with resistor $RR_3$ may also be altered to adjust sound stage extension performance of system 60.

Mathematical explanations describing sound stage expansion are available. An intuitive explanation suffices for purposes of describing the present invention: inverted cross signals of a particular frequency that emanate from one side of a system negate or cancel out a direct signal of the particular frequency from the opposite side of the system, thereby causing the brain of a listener to infer that the direct signal is further away than it actually is.

Figure 3:
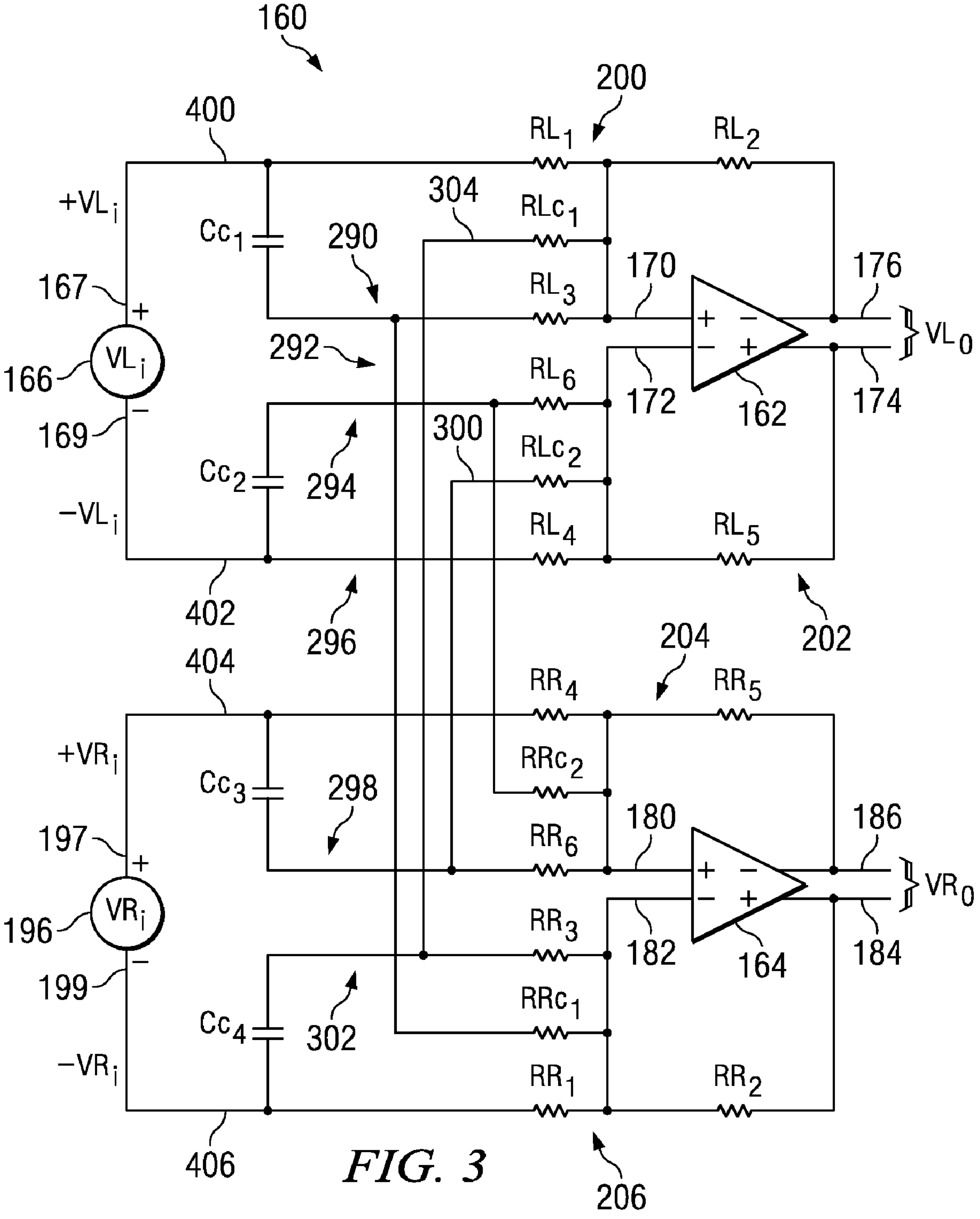

Turning to FIG. 3, another example of a system in accordance with a preferred embodiment of the present invention can be seen. System 160 includes a left amplifier unit 162 and a right amplifier unit 164. Each of amplifier units 162, 164 has a differential input and a differential output. Left amplifier unit 162 has a non-inverting input terminal 170, an inverting input terminal 172 and output terminals 174, 176. System 160 is configured for fully differential signal operation so that left amplifier unit 162 presents a differential output signal so that output signal $+VL_o$ is presented at output terminal 174 and output signal $-VL_o$ is presented at output terminal 176. Output signals $+VL_o$, $-VL_o$ are preferably fully differential output signals so that they are substantially equal in amplitude and opposite in phase with respect to each other. Right amplifier unit 164 has a non-inverting input terminal 180, an inverting input terminal 182 and output terminals 184, 186. System 160 is configured for fully differential signal operation so that right amplifier unit 164 presents a differential output signal so that output signal $+VR_o$ is presented at output terminal 184 and output signal $-VR_o$ is presented at output terminal 186. Output signals $+VR_o$, $-VR_o$ are preferably fully differential output signals so that they are substantially equal in amplitude and opposite in phase with respect to each other.

A left signal providing unit 166 has a positive terminal 167 and a negative terminal 169. Positive terminal 167 is coupled to provide an input signal $+VL_i$ at an input terminal 400. Negative terminal 169 is coupled to provide an input signal $-VL_i$ at an input terminal 402. Input signals $+VL_i$, $-VL_i$ are fully differential input signals so that input signal $+VL_i$ may be regarded as a primary signal and input signal $-VL_i$ may be regarded as an anti-primary signal so that input signals $+VL_i$, $-VL_i$ are substantially equal in amplitude and opposite in phase with respect to each other.

Input signal $+VL_i$ is provided from input terminal 400 to non-inverting input terminal 170 via a first filter unit 290 including a capacitor $Cc_1$ and a resistor $RL_3$. Input signal $+VL_i$ is provided from input terminal 400 to inverting input terminal 182 via a second filter unit 292 including capacitor $Cc_1$ and a cross differencing resistor $RRc_1$. Input signal $-VL_i$ is provided from input terminal 402 to inverting input terminal 172 via a third filter unit 294 including a capacitor $Cc_2$ and a resistor $RL_6$. Input signal $-VL_i$ is provided from input terminal 402 to non-inverting input terminal 180 via a fourth filter unit 296 including capacitor $Cc_2$ and a cross differencing resistor $RRc_2$.

A right signal providing unit 196 has a positive terminal 197 and a negative terminal 199. Positive terminal 197 is coupled to provide an input signal $+VR_i$ at an input terminal 404. Negative terminal 199 is coupled to provide an input signal $-VR_i$ at an input terminal 406. Input signals $+VR_i$, $-VR_i$ are fully differential input signals so that input signal $+VR_i$ may be regarded as a primary signal and input signal $-VR_i$ may be regarded as an anti-primary signal so that input signals $+VR_i$, $-VR_i$ are substantially equal in amplitude and opposite in phase with respect to each other.

Input signal $+VR_i$ is provided from input terminal 404 to non-inverting input terminal 180 via a fifth filter unit 298 including a capacitor $Cc_3$ and a resistor $RR_6$. Input signal $+VR_i$ is provided from input terminal 404 to inverting input terminal 172 via a sixth filter unit 300 including capacitor $Cc_3$ and a cross differencing resistor $RLc_2$. Input signal $-VL_i$ is provided from input terminal 406 to inverting input terminal 182 via a seventh filter unit 302 including a capacitor $Cc_4$ and a resistor $RR_3$. Input signal $-VL_i$ is provided from input terminal 406 to non-inverting input terminal 170 via an eighth filter unit 304 including capacitor $Cc_4$ and a cross differencing resistor $RLc_1$.

A feedback network 200 including resistors $RL_1$, $RL_2$ couples output terminal 176 with non-inverting terminal 170 and positive terminal 167. A feedback network 202 including resistors $RL_3$, $RL_4$ couples output terminal 174 with inverting terminal 172 and negative terminal 169. A feedback network 204 including resistors $RR_4$, $RR_5$ couples output terminal 186 with non-inverting terminal 180 and positive terminal 197. A network 206 including resistors $RR_1$, $RR_2$ couples output terminal 184 with inverting terminal 182 and negative terminal 199.

Cross differencing filter units 292, 296, 300, 304 permit adjustment of center audio image presented by system 160. Changing values of capacitors $Cc_1$, $Cc_2$, $Cc_3$, $Cc_4$ or resistors $RLc_1$, $RLc_2$, $RRLc_1$, $RRc_2$ can alter the center image presented by system 160 to a significant degree. Filter units 290, 294, 298, 302 established by capacitors may also be adjusted by changing values of capacitors $Cc_1$, $Cc_2$, $Cc_3$, $Cc_4$ or resistors $RL_3$, $RL_6$, $RR_3$, $RR_6$ to alter sound stage extension performance of system 160.

Figure 4:
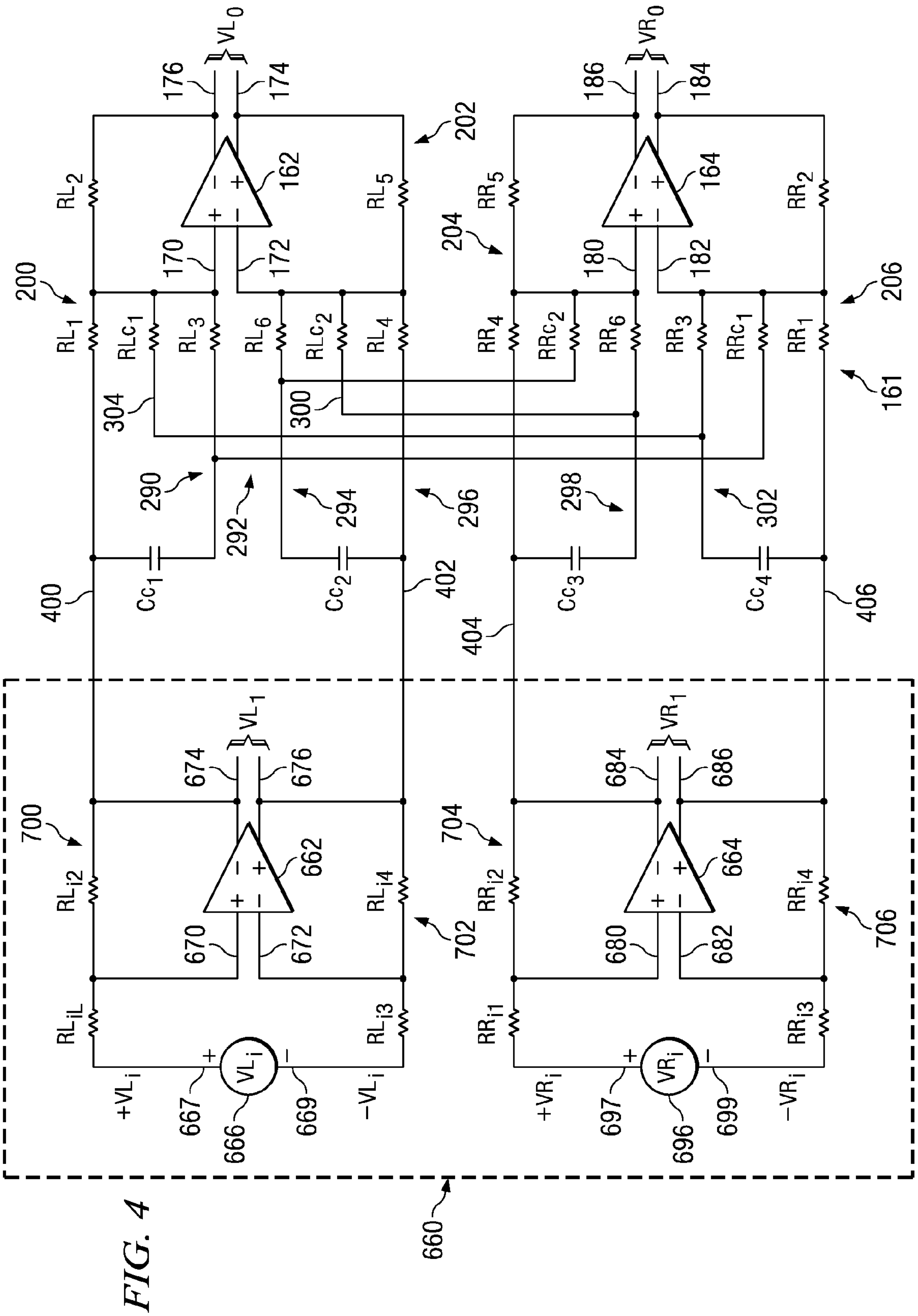

Turning to FIG. 4, another example of a system in accordance with a preferred embodiment of the present invention can be seen. System 161 is coupled to receive input signal from an input device 660 at input terminals 400, 402, 404, 406. System 161 is substantially the same as system 160 described in connection with FIG. 3 except that system 161 receives input signals from an input device 660 rather than receiving input signals directly from signal providing units (e.g., signal providing units 166, 196; FIG. 3). In order to avoid prolixity, a detailed description of system 161 will not be provided here. One may refer to the description of system 160 (FIG. 3) for an understanding of the structure and operation of system 161.

Input device 660 includes a left amplifier unit 662 and a right amplifier unit 664. Left amplifier unit 662 has a non-inverting input terminal 670, an inverting input terminal 672 and output terminals 674, 676. Input device 660 is configured for fully differential signal operation so that left amplifier unit 662 presents a differential output signal so that output signal $+VL_1$ is presented at output terminal 674 and output signal $-VL_1$ is presented at output terminal 676. Output signals $+VL_1$, $-VL_1$ are preferably fully differential output signals so that they are substantially equal in amplitude and opposite in phase with respect to each other. Output signal $+VL_1$ is provided to input terminal 400 of system 161. Output signal $-VL_1$ is provided to input terminal 402 of system 161. Right amplifier unit 664 has a non-inverting input terminal 680, an inverting input terminal 682 and output terminals 684, 686. Input device 660 is configured for fully differential signal operation so that right amplifier unit 664 presents a differential output signal so that output signal $+VR_1$ is presented at output terminal 684 and output signal $-VR_1$ is presented at output terminal 686. Output signals $+VR_1$, $-VR_1$ are preferably fully differential output signals so that they are substantially equal in amplitude and opposite in phase with respect to each other. Output signal $+VR_1$ is provided to input terminal 404 of system 161. Output signal $-VR_1$ is provided to input terminal 406 of system 161.

A left signal providing unit 666 has a positive terminal 667 and a negative terminal 669. Positive terminal 667 is coupled to provide an input signal $+VL_i$ to non-inverting input terminal 670 via a resistor $RL_{i1}$. Negative terminal 669 is coupled to provide an input signal $-VL_i$ to inverting input terminal 672 via a resistor $RL_{i3}$. Input signals $+VL_i$, $VR_i$ are illustrated in FIG. 4 as being differential signals. Alternatively, input signals $+VL_i$, $VR_i$ may be presented as single-ended signals and, if so presented, input signals $+VL_i$, $VR_i$ may be converted to differential signals at input terminals 400, 402, 404, 406, as may be understood by one skilled in the art of audio circuit design.

A feedback network 700 including resistors $RL_{i1}$, $RL_{i2}$ couples output terminal 674 with non-inverting terminal 670 and positive terminal 667. A feedback network 702 including resistors $RL_{i3}$, $RL_{i4}$ couples output terminal 676 with inverting terminal 672 and negative terminal 669. A feedback network 704 including resistors $RR_{i1}$, $RR_{i2}$ couples output terminal 684 with non-inverting terminal 680 and positive terminal 697. A network 706 including resistors $RR_{i3}$, $RR_{i4}$ couples output terminal 686 with inverting terminal 682 and negative terminal 699.

Input signals $+VL_1$, $-VL_1$, $+VR_1$, $-VR_1$, are provided from input terminals 400, 402, 404, 406 for use by system 161 substantially as described with respect to signals arriving at terminals 400, 402, 404, 406 in apparatus 160 (FIG. 3).

FIG. 4 illustrates that the apparatus of the present invention may be employed with originating signal providing units (e.g., signal providing units 166, 196; FIG. 3) or may be employed to effect sound stage expansion for a sound presenting unit such as a stereo amplifying unit (e.g., input device 660; FIG. 4). Signals provided to the apparatus of the present invention, therefore, may be already amplified signals, or filtered signals or amplified and filtered signals. Signals provided to the apparatus of the present invention may have already been subjected to sound expansion treatment. Said another way, the apparatus of the present invention may be embodied in original equipment integrally included in an audio system. Alternatively, the apparatus of the present invention may be employed as an additional, add-on or after market module receiving output signals from an audio system and effecting sound stage expansion with regard to those output signals received from the audio system.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus for expanding sound stage representation of an audio system presenting two sound channels, the apparatus comprising:

a first amplifier unit having a first inverting input terminal, a first non-inverting input terminal and a first output terminal;

a second amplifier unit having a second inverting input terminal, a second non-inverting input terminal and a second output terminal;

a right channel signal source coupled for providing a first right channel signal and a second right channel signal to the first amplifier unit; one right channel signal of the first and second right channel signals being provided to the first inverting input terminal, an other right channel signal of the first and second right channel signals being provided to the first non-inverting input terminal;

a left channel signal source coupled for providing a first left channel signal and a second left channel signal to the second amplifier unit; one of the first and second left channel signals being provided to the second inverting input terminal, an other one of the first and second left channel signals being provided to the second non-inverting input terminal;

a first filter unit coupled for providing filtered the one right channel signal to the second non-inverting input terminal;

a second filter unit coupled for providing filtered the other right channel signal to the second inverting input terminal;

a third filter unit coupled for providing filtered the one left channel signal to the first non-inverting input terminal; and a fourth filter unit coupled for providing filtered the other left channel signal to the first inverting input terminal.

2. The apparatus of claim 1, wherein the first and second right channels are provided as substantially fully differential signals, and wherein the first and second left channels are provided as substantially fully differential signals.

3. The apparatus of claim 1, wherein at least one selected filter unit of the first filter unit, the second filter unit, the third filter unit and the fourth filter unit includes at least one capacitive unit coupled with at least one resistive unit.

4. The apparatus of claim 2, wherein at least one selected filter unit of the first filter unit, the second filter unit, the third filter unit and the fourth filter unit includes at least one capacitive unit coupled with at least one resistive unit.

5. An integrated circuit for effecting sound stage expansion in an audio system, the integrated circuit comprising: a first amplifier having a inverting input terminal, a non-inverting input terminal, and an output terminal; a second amplifier having a inverting input terminal, a non-inverting input terminal, and an output terminal; a first resistor-capacitor (RC) network that receives a first input signal from a left channel signal source and that is coupled to inverting terminal of the first amplifier and the non-inverting terminal of the second amplifier; and a second RC network that receives a second input signal from a fight channel signal source and that is coupled to the inverting terminal of the second amplifier and the non-inverting terminal of the first amplifier.

6. The integrated circuit of 5, wherein the apparatus further comprises a resistor network that is coupled between the non-inverting terminals of the first and second amplifiers.

7. The integrated circuit of claim 6, wherein the first RC network further comprises: a capacitor that receives the first input signal; a first resistor that receives the first input signal and that is coupled to the inverting terminal of the first amplifier; a second resistor that is coupled between the capacitor and the inverting terminal of the first amplifier; a third resistor that is coupled between the capacitor and the non-inverting terminal of the second amplifier; and a fourth resistor that is coupled between the output terminal and the inverting terminal of the first amplifier.

8. The integrated circuit of claim 6, wherein the second RC network further comprises: a capacitor that receives the second input signal; a first resistor that receives the second input signal and that is coupled to the inverting terminal of the first amplifier; a second resistor that is coupled between the capacitor and the inverting terminal of the second amplifier; a third resistor that is coupled between the capacitor and the non-inverting terminal of the first amplifier; and a fourth resistor that is coupled between the output terminal and the inverting terminal of the second amplifier.

9. The integrated circuit of claim 5, wherein the first and second input signals are differential, and wherein the first RC network receives a negative portion of the first input signal, and wherein the second RC network receives a negative portion of the second input signal.

10. The integrated circuit of claim 9, wherein the apparatus further comprises: a third RC network that receives a positive portion of the first input signal and that is coupled to the non-inverting terminal of the first amplifier; and a fourth RC network that receives a positive portion of the second input signal and that is coupled to the non-inverting terminal of the second amplifier.

11. The integrated circuit of claim 10, wherein the first RC network further comprises: a capacitor that receives the negative portion of the first input signal; a first resistor that receives the first input signal and that is coupled to the inverting terminal of the first amplifier; a second resistor that is coupled between the capacitor and the inverting terminal of the first amplifier; and a third resistor that is coupled between the capacitor and the non-inverting terminal of the second amplifier.

12. The integrated circuit of claim 11, wherein the capacitor further comprises a first capacitor, and wherein the third RC network further comprises: a second capacitor that receives the positive portion of the first input signal; a fourth resistor that receives the first input signal and that is coupled to the non-inverting terminal of the first amplifier; a fifth resistor that is coupled between the second capacitor and the non-inverting terminal of the first amplifier; a sixth resistor that is coupled between the second capacitor and the inverting terminal of the second amplifier.

13. The integrated circuit of claim 10, wherein the second RC network further comprises: a capacitor that receives the negative portion of the second input signal; a first resistor that receives the second input signal and that is coupled to the inverting terminal of the first amplifier; a second resistor that is coupled between the capacitor and the inverting terminal of the second amplifier; and a third resistor that is coupled between the capacitor and the non inverting terminal of the first amplifier.

14. The integrated circuit of claim 13, wherein the capacitor further comprises a first capacitor, and wherein the third RC network further comprises: a second capacitor that receives the positive portion of the second input signal; a fourth resistor that receives the first input signal and that is coupled to the non-inverting terminal of the second amplifier; a fifth resistor that is coupled between the second capacitor and the non-inverting terminal of the second amplifier; a sixth resistor that is coupled between the second capacitor and the inverting terminal of the first amplifier.

* * * * *